(12) United States Patent
Giardina et al.

(10) Patent No.: US 6,355,324 B1
(45) Date of Patent: Mar. 12, 2002

(54) MULTIPLE COATED SUBSTRATES

(75) Inventors: Richard N. Giardina; Craig C. Sundberg, both of Erie; Timothy A. Kuzma, Cranesville, all of PA (US)

(73) Assignee: The Erie Ceramic Arts Company, Erie, PA (US)

( * ) Notice: Subject to any disclaimer, the term of this patent is extended or adjusted under 35 U.S.C. 154(b) by 0 days.

(21) Appl. No.: 09/713,438

(22) Filed: Nov. 15, 2000

Related U.S. Application Data

(62) Division of application No. 08/947,119, filed on Oct. 8, 1997, now Pat. No. 6,195,881.

(51) Int. Cl.$^7$ ................................................ B32B 3/30
(52) U.S. Cl. ........................ 428/43; 428/209; 428/210; 428/901
(58) Field of Search .......................... 428/43, 600, 210, 428/209, 901

(56) References Cited

U.S. PATENT DOCUMENTS

| | | | | |
|---|---|---|---|---|
| 4,366,198 A | * | 12/1982 | Ramspacher | 428/43 |
| 5,554,965 A | | 9/1996 | Sundberg | 338/160 |
| 5,605,715 A | | 2/1997 | Giardina et al. | 427/96 |
| 5,773,764 A | * | 6/1998 | Vajna | 174/250 |
| 5,834,084 A | | 11/1998 | Maggio | 428/64.1 |
| 6,007,886 A | * | 12/1999 | Takigami | 428/43 |

* cited by examiner

Primary Examiner—Alexander S. Thomas
(74) Attorney, Agent, or Firm—Rankin, Hill, Porter & Clark LLP

(57) ABSTRACT

The present invention provides a metal substrate parts gang having a frame, multiple substrates and multiple connective portions. The connective portions include a notched portion or break-out zone. A coating of resist or mask material is applied in the immediate proximity of the notched portion and then a layer of dielectric coating material is applied to the carrier gang. The resist serves to prevent the deposition of the dielectric coating material in the proximity of the notched portion. After coating, the carrier gang is fired in order to cure the dielectric material. The piece of base metal may be further processed, for example, screen printed with thick or think film inks. When required, the piece of base metal can be easily removed or separated from the frame by bending and/or twisting.

9 Claims, 2 Drawing Sheets

MULTIPLE COATED SUBSTRATES

RELATED APPLICATIONS

This application is a divisional filing of application Ser. No. 08/947,119 filed Oct. 8, 1997, U.S. Pat. No. 6,195,881.

TECHNICAL FIELD

The present invention concerns a method of making coated metal substrates for use in electronic applications. More particularly, the present invention concerns a high volume method of making such coated metal substrates that involves the formation of an integral gang of such substrates.

BACKGROUND

Porcelain enamel metal substrates are well-known in the prior art and are used extensively in electronic applications. Examples of such substrates and methods of making them are disclosed in U.S. Pat. Nos. 5,605,715 and 5,554,965.

In the prior art such metal coated substrates were generally produced by one of two methods. In one method, the coated substrates are produced individually or one at a time. Unfortunately, this can be a very time consuming and costly approach to producing the coated substrates. In another method, a chisel mark is placed in the base metal during metal fabrication to facilitate the separation of the substrate from the carrier gang frame. During the deposition of the porcelain coating on the base metal the chiseled area is also coated. During the breaking out of the substrate from the carrier gang frame a mechanical parting tool is required and the enamel coating produces fractures in the coating creating a friable unstable edge. Unfortunately, this edge is a source of contamination during subsequent processing and during the breaking out step the fracturing enamel can become an undesirable foreign body in the eyes of the worker who is conducting such breakout.

SUMMARY OF INVENTION

The present invention allows one to manufacture porcelain enamel coated metal substrates in gangs or groups. Each individual substrate can be easily parted or separated from the gang matrix by hand without chipping the glass-like insulative coating. Thus, no special parting tools are required. Production of the substrates in a gang matrix can result in a significant savings in time and improved handling.

In a preferred embodiment the method of the present invention comprises the steps of fabricating from a section of metal a carrier gang comprising a frame, a piece of base metal which later forms a substrate and a connective portion connecting or linking the piece of base metal to the frame. The connective portion includes a notch. A coating of resist or mask material is applied in the immediate proximity of the notch and then a layer of porcelain enamel coating material is applied to the carrier gang. The resist serves to prevent the deposition of the enamel coating material in the proximity of the notch. After coating the carrier gang is fired in order to cure the enamel. The piece of base metal may be further processed, for example, screen printed with thick films or inks. When required, the piece of base metal can be easily removed from the frame by bending and/or twisting. No mechanical parting tool is required to separate the base metal piece from the frame.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION

The present invention allows porcelain enamel coated metal substrates, which are manufactured in gangs, to be parted easily from the frame of the gang matrix by hand without chipping the friable glass-like insulative coating. Without this invention special parting tools must be utilized and for lower volume products or runs this is not always economically feasible.

By applying a resist to the tab or connective portion of the gang matrix the chipping of the enamel coating material is eliminated and the initial force required to bend a single substrate for the first time is reduced.

Figure 1:
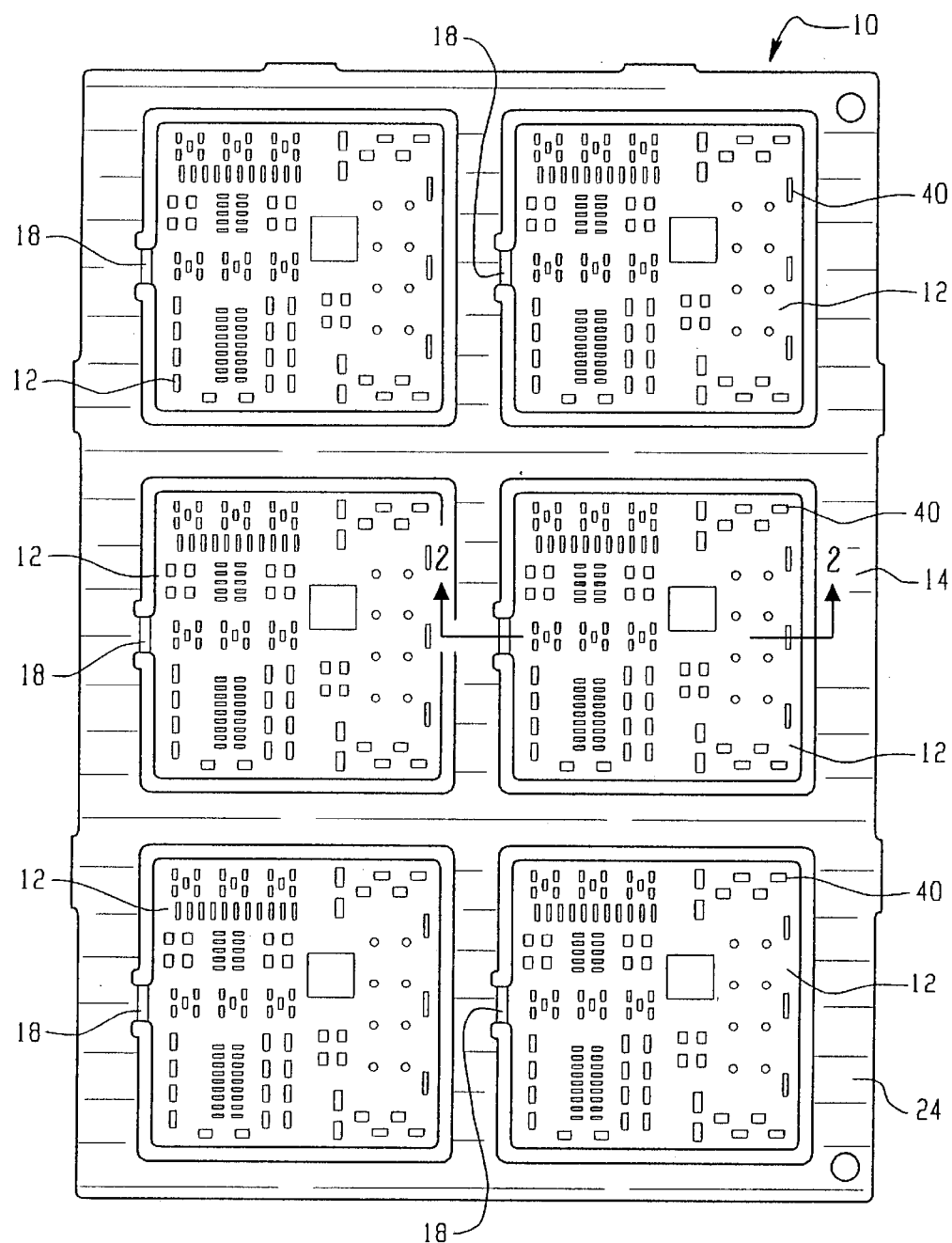
FIG. 1 is a top view of a coated carrier gang made in accordance with the present invention.
Figure 2:
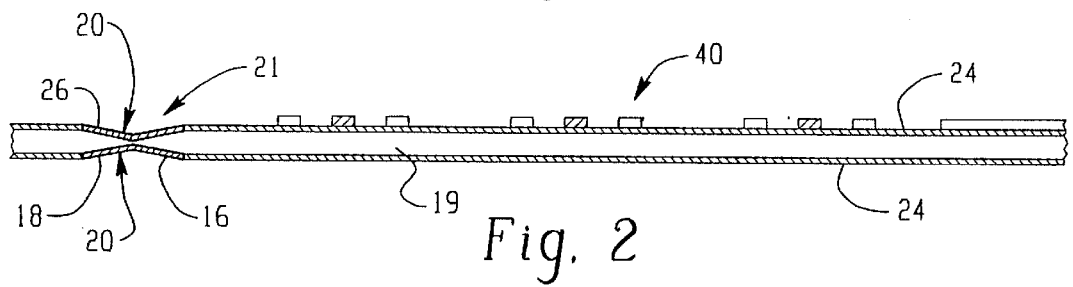
FIG. 2 is a broken-away cross-sectional view of one of the base pieces taken along line 2-2 of FIG. 1.

Referring to the drawings, and initially to FIGS. 1 and 2, there is illustrated a part gang matrix 10 made in accordance with the present invention. The gang includes multiple pieces of base metal or substrates 12, a frame 14 and multiple connective portions 18 that attach each of the substrates 12 to the frame 14. Substrates 12, frame 14 and connective portions 18 are all formed from a single piece of metal 19 such as decarburized steel using conventional tooling. During forming, a pair of diametrically opposed V-shape notches 20 are formed in the connective portion 18. These notches 20 create a break-out zone 21 that facilitates the removal of the substrates 12 from the frame 14.

Disposed on each side of almost the entire gang 10 is a layer of dielectric material 24 such as a conventional porcelain enamel material bonded thereto. A selected portion of the notches 20 includes resist or mask material 26 secured thereto.

The resist 26 is formed of a material that is immiscible, or in other words, that resists or repulses the dielectric material utilized to form the layer 24. This results in the outer surface of the resist material 26 and thus the break-out zone 21 being free of the dielectric material as best seen in FIG. 2.

One typical procedure for forming the gang 10 is accomplished as follows:

A section of decarburized steel metal is formed by stamping a piece coupon from a steel sheet of a desired thickness. This coupon includes the uncoated frame, the base pieces or substrates, connective portions and notches. The coupon is treated by pickling or some other conventional metal pretreatment process. Then a thick film of resist such as a nickel alloy thick film is printed, such as by screen printing, brushing, fluid dispensing or spraying at a desired location on the respective surface of the notches 20.

The resulting product is emersed in a conventional acidic copper sulphate solution for a brief period of time (about 1 minute) after which it is dipped in a slurry of dielectric particles such as conventional porcelain enamel particles. Within the slurry are fixed cathodes and the preliminary assembly or substrate is electrically connected in such a way that it acts as an anode and attracts the solid particles in the slurry by electrophoresis. As a result, the dielectric particles are deposited on all surfaces of the coupon to form a coating. However, the thick film of resist material resists the permanent attachment of the particles due to its immiscible character. Thus, the break-out zone is rendered free of dielectric particles or coating material.

When the coated product is removed from the slurry, it is dried and then heated or fired to a sintering temperature such as around 1500° F. Of course, it will be appreciated that the exact sintering or fusing temperature and time will depend upon the particular dielectric or resistive material being used.

A typical thick film that may be used in the process when utilizing a ferrous substrate is a product identified by the trade designation 2554 or 2554-E and sold by Electro Science Labs (ESL). This product is a nickel cermet thick film. It consists of nickel particles held together in a matrix of boro-silicate glass. Preferably, in order to facilitate its application the thick film is diluted with a Drakenfeld oil sold under the trade designation 401. The proportions are generally about 3% by weight oil to about 97% by weight thick film. It will be appreciated that in addition the above identified thick films, any number of other conventional thick film or metal paste products may be utilized so long as they form a conductive coating and prevent or resist the deposition of the dielectric or resistive material. Additionally, when utilizing stainless steel to form the coupons, applicants believe that it should be possible to use a nonmetallic oil based resist that is completely volatilized and removed during the subsequent sintering step.

Any number of conventional dielectric or resistive coating materials may be used in connection with the present invention. Such coatings maybe classified as either "porcelain enamel," "glass" or "ceramic." Such "porcelain enamel" or "glass" coatings may be referred to as "vitreous" coatings. Such "ceramic" coatings may be referred to as "devitrified" coatings. Examples of such coatings may be found in Lim et al., U.S. Pat. No. 5,002,903; Ohmura et al., U.S. Pat. No. 4,361,654; Kaup et al., U.S. Pat. No. 3,935,088; Moritsu et al., U.S. Pat. No. 4,172,733; Van derVliet, U.S. Pat. No. 4,085,021; Hang et al., U.S. Pat. No. 4,256,796; Andrus et al., U.S. Pat. No. 4,358,541; Chyung, U.S. Pat. No. 4,385,127; Gazo et al. U.S. Pat. No. 3,841,986 and Hughes U.S. Pat. No. 3,575,838. Applicants hereby incorporate by reference the coatings disclosed in such U.S. Patents including the methods of making such coatings and applying such coatings to a metal substrate.

It will be appreciated that any number of coating baths and coating application techniques such as electrostatic spray application may be employed. It will also be appreciated that different dielectric or resistive coatings, and firing temperatures may be utilized when practicing the present invention. Such parameters are generally a function of the type of metal being utilized to form the substrates.

It will further be appreciated that any number of different types of metals may be used in connection with the present invention. Such metals may comprise for example, a ferrous alloy such as carbon steel(including low carbon steel) or stainless steel, copper, aluminum, decarburized steel and copper-beryllium.

After application of the dielectric layer 24 the substrates 12 may be separated from the frame 14 and further processed individually, or such substrates 12 may be further processed as a single unit and separated subsequent to such further processing. However, in most circumstances, it is advantageous to conduct further processing as a single unit or gang.

Further processing includes, for example, the formation of circuit patterns 40 using conductive or resistive thick or thin films, the addition of circuit related hardware such as wipers, terminals, contacts, etc.

Figure 3:
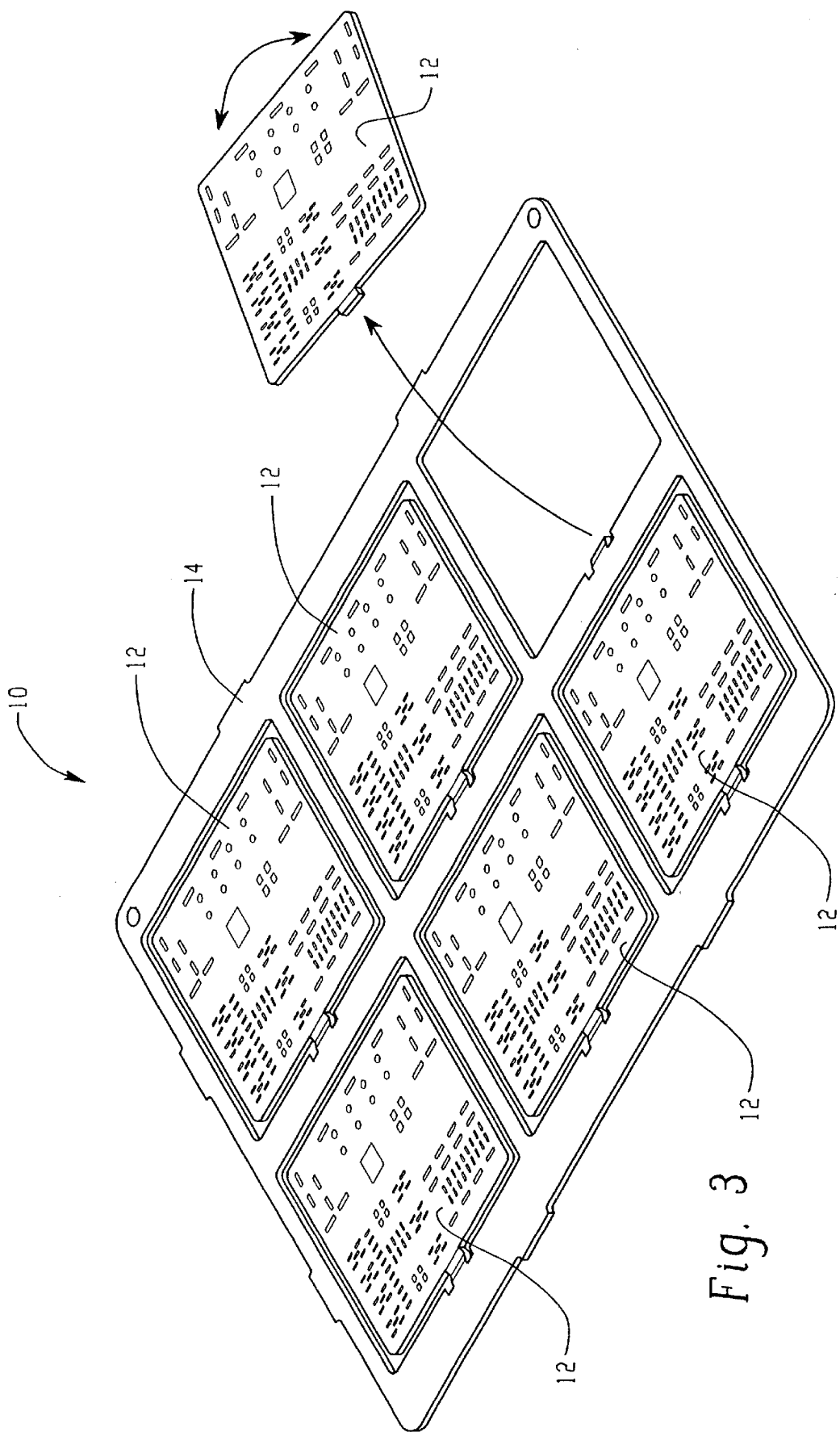
FIG. 3 is a perspective view of the coated carrier gang of FIG. 1 illustrating the breaking out thereof of one of the substrates.

As shown in FIG. 3, substrates 12 are easily removed from the frame 14 by slightly bending and/or twisting the substrates. Removal of the substrates 12 does not in any way interfere with or break the enamel coating since in the area of the break there is no such coating due to the presence of the resist material.

It will be appreciated that in addition to the illustrated double notch configuration, other configurations may be employed to form a break-out zone having reduced thickness and strength which serves to facilitate the easy removal of the substrates from the frame. For example, a single notch emanating from one side and having a greater depth than notches 20 may be employed. Alternatively, instead of a V-shape notch, a very thin flat cross section could be formed. Whatever the configuration, the resist material will have to be applied in the proximity of the break-out zone.

While the invention has been shown and described with respect to specific embodiments of he methods and products thereof, this is intended for the purpose of illustration rather than limitation and other variations and modifications of the specific methods and products herein shown and described may be used all within the intended spirit and scope of the invention. Accordingly, the invention is not to be limited in scope and effect to the specific embodiments herein shown and described nor in any other way that is inconsistent with the extent to which the progress in the art has been advanced by the invention.

What is claimed:

1. A metal substrate parts gang comprising a frame, multiple substrates and multiple connective portions which serve to attach each of the substrates to the frame, said gang having a coating of dielectric material over substantially all of its exposed surfaces, and said connective portions each including a break-out zone which is free of said dielectric material and which serves to facilitate the removal by bending of said substrates from said frame.

2. A gang as set forth in claim 1 wherein said break-out zone comprises a notched portion.

3. A gang as set forth in claim 2 wherein said notched portion comprises a pair of V-shape diametrically opposed notches.

4. A gang as set forth in claim 1 wherein said break-out zone includes a coating of resist material.

5. A gang as set forth in claim 4 wherein said resist material comprises a nickel cermet thick film.

6. A gang as set forth in claim 1 wherein said dielectric coating comprises a coating material selected from the group consisting of a porcelain enamel, a glass and a ceramic.

7. A gang as set forth in claim 1 wherein said metal comprises a metal selected from the group consisting of steel, low carbon steel, decarburized steel, copper, aluminum and copper-beryllium.

8. A gang as set forth in claim 1 including circuit patterns formed upon said multiple substrates.

9. A gang as set forth in claim 1 wherein said break-out zone of said connective portion is formed by a pair of diametrically opposed notches.

* * * * *